(12) United States Patent
Kasko et al.

(10) Patent No.: US 7,087,438 B2
(45) Date of Patent: Aug. 8, 2006

(54) ENCAPSULATION OF CONDUCTIVE LINES OF SEMICONDUCTOR DEVICES

(75) Inventors: Ihar Kasko, Mennecy (FR); Kia-Seng Low, Hopewell Junction, NY (US); John P. Hummel, Verbank, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/898,858

(22) Filed: Jul. 26, 2004

(65) Prior Publication Data
US 2006/0019431 A1    Jan. 26, 2006

(51) Int. Cl.
*H01L 21/00* (2006.01)

(52) U.S. Cl. .................... 438/3; 438/238; 438/381
(58) Field of Classification Search .................... 438/3, 438/238, 381, 680, 681, 687, 723, 724, 728, 438/756, 757, 692, 712, 740
See application file for complete search history.

(56) References Cited

U.S. PATENT DOCUMENTS

| | | | |
|---|---|---|---|
| 6,294,456 B1 | 9/2001 | Lee et al. | |
| 6,440,753 B1* | 8/2002 | Ning et al. | 438/3 |
| 6,576,545 B1 | 6/2003 | Hopper et al. | |
| 6,713,802 B1* | 3/2004 | Lee | 257/295 |
| 6,783,999 B1* | 8/2004 | Lee | 438/3 |

* cited by examiner

*Primary Examiner*—David Nhu
(74) *Attorney, Agent, or Firm*—Slater & Matsil, L.L.P.

(57) ABSTRACT

The invention relates to a method of encapsulating conductive lines of semiconductor devices and a structure thereof. An encapsulating protective material, such as TaN, Ta, Ti, TiN, or combinations thereof is disposed over conductive lines of a semiconductor device. The encapsulating protective material protects the conductive lines from harsh etch chemistries when a subsequently deposited material layer is patterned and etched. The encapsulating protective material is conductive and may be left remaining in the completed semiconductor device. The encapsulating material is patterned using a masking material, and processing of the semiconductor device is then continued. The masking material may be left remaining in the structure as part of a subsequently deposited insulating material layer.

22 Claims, 2 Drawing Sheets

ENCAPSULATION OF CONDUCTIVE LINES OF SEMICONDUCTOR DEVICES

CROSS-REFERENCE TO RELATED APPLICATIONS

This application relates to the following co-pending and commonly assigned patent application Ser. No. 10/610,609, filed on Jul. 1, 2003, entitled, "Recessed Metal Lines for Protective Enclosure in Integrated Circuits," which application is hereby incorporated herein by reference.

TECHNICAL FIELD

The present invention relates generally to semiconductor devices, and more particularly to protecting conductive lines while patterning subsequently deposited material layers.

BACKGROUND

A recent development in semiconductor memory devices involves spin electronics, which combines semiconductor technology and magnetics. The spin of electrons, rather than the charge, is used to indicate the presence of binary states "1" and "0." One such spin electronic device is a magnetic random access memory (MRAM) device, which includes conductive lines (wordlines and bitlines) positioned in a different direction, e.g., perpendicular to one another in different metal layers, the conductive lines sandwiching a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the component's resistive state.

MRAM devices are typically arranged in an array of rows and columns, and the wordlines and bitlines are activated to access each individual memory cell. In a cross-point MRAM array, current is run through the wordlines and bitlines to select a particular memory cell. In a field effect transistor (FET) array, each MTJ is disposed proximate a FET, and the FET for each MTJ is used to select a particular memory cell in the array. In a FET array, an electrode is typically formed between the MTJ and the FET to make electrical contact between the MTJ and the FET.

An advantage of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be continually powered to "remember" the stored data. Therefore, it is expected that MRAM devices will replace flash memory, DRAM and static random access memory devices (SRAM) devices in electronic applications where a memory device is needed.

Because MRAM devices operate differently than traditional memory devices and because they are relatively new, they introduce design and manufacturing challenges. For example, the conductive lines in MRAM device typically comprise copper because of its low resistivity and high conductivity compared with other conductive materials. Copper is difficult to directly pattern or etch, and thus, damascene processes are typically used to form copper interconnects. Exposed copper lines and vias are particularly susceptible to corrosion resulting from subsequent processing steps. Consequently, many of the more effective processing steps are simply too harsh to be used with such exposed copper lines. In particular, etching or patterning of the magnetic materials used to form magnetic stacks of MRAM devices requires harsh chemistries that can damage copper conductive lines, deleteriously affecting the MRAM device. Such limits on the available etching techniques and other processing requires costly modifications to a less expensive process flow that might otherwise be used. Therefore, it would be advantageous if the more effective, yet harsher, processing steps could be used on substrates containing copper damascene type integrated structures.

SUMMARY OF THE INVENTION

These and other problems are generally solved or circumvented, and technical advantages are generally achieved, by embodiments of the present invention, which provide methods and apparatus in a semiconductor structure to enhance further processing of the semiconductor device. Embodiments of the present invention not only allow the use of very harsh processing steps, including chlorine-based etching steps, to be used with a copper damascene structures, but also controls out-diffusion or migration of harmful metal ions and atoms to adjacent sensitive circuits. Embodiments of the present invention are described and illustrated herein with reference to MRAM devices; however, embodiments of the present invention also have useful application in other semiconductor device and integrated circuit designs.

In accordance with a preferred embodiment of the present invention, a method of manufacturing a semiconductor device includes providing a workpiece, the workpiece including an insulating layer disposed thereon and a first conductive line disposed within the insulating layer, the first conductive line having a first top surface, the insulating layer having a second top surface, wherein the second top surface of the first insulating layer is substantially coplanar with the first top surface of the first conductive line. An encapsulating protective material is deposited over the first top surface of the first conductive line and over the second top surface of the insulating layer. At least one material layer is deposited over the encapsulating protective material, the at least one material layer is patterned to form a patterned structure over the first conductive line, and a masking material is deposited over the patterned structure and the encapsulating protective material. The method includes patterning the masking material, and patterning the encapsulating protective material using the masking material as a mask, wherein the encapsulating protective material protects the first conductive line during the patterning of the at least one material layer.

In accordance with another preferred embodiment of the present invention, a method of manufacturing a magnetic memory device includes providing a workpiece, forming a plurality of first conductive lines over the workpiece, the first conductive lines having a first top surface, and disposing a first insulating layer over the workpiece, the first insulating layer having a second top surface, wherein the first insulating layer is disposed between the first conductive lines, wherein the second top surface of the first insulating layer is substantially coplanar with the first top surface of the first conductive lines. The method includes depositing an encapsulating protective material over the first top surface of the first conductive lines and over the second top surface of the first insulating layer, depositing a magnetic stack over the encapsulating protective material, and patterning the magnetic stack to form an MTJ over each first conductive line. A first masking material is deposited over the magnetic stack and the encapsulating protective material, and the first masking material is patterned. The encapsulating protective material is patterned using the first masking material as a mask. The encapsulating protective material protects the plurality of first conductive lines during the patterning of the magnetic stack.

In accordance with yet another preferred embodiment of the present invention, an MRAM device includes a workpiece, a plurality of first conductive lines disposed over the workpiece, the first conductive lines having a first top surface and being positioned in a first direction, and a first insulating layer disposed over the workpiece, the first insulating layer having a second top surface, wherein the first insulating layer is disposed between the first conductive lines, wherein the second top surface of the first insulating layer is substantially coplanar with the first top surface of the first conductive lines. An encapsulating protective material is disposed over at least the first top surface of the first conductive lines, and an MTJ is disposed over the encapsulating protective material over a portion of each first conductive line. A second insulating layer is disposed between the MTJ's, and a plurality of second conductive lines is disposed over the MTJ's, each second conductive line being disposed over an MTJ, the second conductive lines being positioned in a second direction, wherein the second direction is different from the first direction. A third insulating layer is disposed between the plurality of second conductive lines.

The methods and semiconductor devices described herein comprise a substrate with a dielectric having a top surface that defines at least one area of metallization having an exposed top surface such as is provided by a typical copper damascene process. For many applications, the area of metallization formed by the damascene process will also include a barrier liner covering the sides and bottom of the cavity, trench, or via before the copper or other metal is deposited. Suitable materials for the barrier liner include, but are not necessarily limited to, Tantalum (Ta), Tantalum Nitride (TaN), Titanium (Ti), Titanium Nitride (TiN), Silicon Nitride (SiN), and Silicon Carbide (SiC), as examples. A planar layer of encapsulating protective material, such as TaN, Ta, Ti, TiN, or combinations thereof, as examples, is then deposited over at least the top surface of the area of metallization to encase or encapsulate the area of metallization. The layer of encapsulating protective material may be planarized by a CMP (Chemical Mechanical Polish) to provide a very smooth top surface for the formation of subsequently deposited materials and devices, for example. The planarized encapsulated or protected areas of metallization provide a smoother surface for successive processing steps and also allow more aggressive or harsh processing steps. As a first example, a stack of magnetic films can be deposited over the dielectric layer and the protected areas of metallization. The magnetic stack of films can then be pattern etched with a chlorine-based RIE (Reactive Ion Etch), which is too corrosive to be used with exposed copper lines. The material encasing the areas of metallization also functions as a barrier to migration or electromigration of metal ions or atoms, such as copper for example, into the vicinity of sensitive circuit components or into the adjacent insulating materials. The encapsulation of the areas of metallization provides an effective adhesion promoter and protection against oxidation or corrosion so that a wider range of dielectrics can be utilized as films to be deposited on the areas of metallization. For example, one could use silicon oxide directly on the area of metallization without an intermediate silicon nitride layer, and thus reduce significantly the effective dielectric constant and capacitance of the structure. The encapsulating protective layer also functions as an etch stop for a subsequently deposited material layer in one embodiment.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM device. The invention may also be applied, however, to other semiconductor devices, and has particular useful application when magnetic materials are used as material layers, for example.

In U.S. patent application Ser. No. 10/610,609, filed on Jul. 1, 2003, entitled, "Recessed Metal Lines for Protective Enclosure in Integrated Circuits," which is incorporated herein by reference, methods of recessing damascene conductive lines and filling the recess with a capping liner or barrier layer are described. The capping liner formed within the conductive line recess comprises Ta, TaN, Ti, TiN, SiN, or SiC, some of which materials are non-conductive, for example.

Embodiments of the present invention achieve technical advantages by providing a method of forming an encapsulating protective material over damascene-formed or subtractively etched conductive lines, wherein recessing the conductive lines prior to depositing the encapsulating protective material is not required. The encapsulating protective material is preferably a conductive material, so that the conductive material will make electrical connection to subsequently formed electrical elements and integrated circuit components.

FIGS. 1 through 7 show cross-sectional views of an MRAM semiconductor device 10 at various stages of manufacturing in accordance with a preferred embodiment of the present invention, wherein an encapsulating protective material 50 is used to protect areas of metallization 18/20 from aggressive and harsh processing steps.

Figure 1:
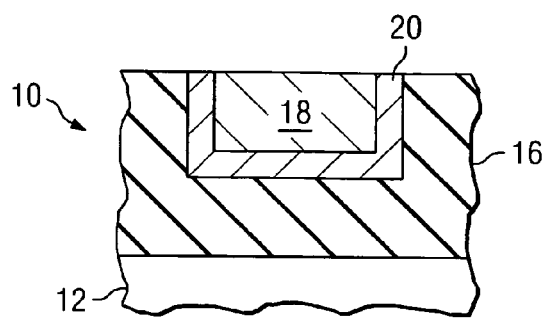
FIGS. 1 through 7 show cross-sectional views of an MRAM semiconductor device at various stages of manufacturing in accordance with an embodiment of the present invention, wherein an encapsulating protective material is used to protecting areas of metallization from aggressive and harsh processing steps.

Referring first to FIG. 1, a workpiece 12 is provided. The workpiece 12 may include a semiconductor substrate comprising silicon or other semiconductor materials covered by an insulating layer, for example. The workpiece 12 may also include other active components or circuits, not shown. The workpiece 12 may comprise silicon oxide over single-crystal silicon, for example. The workpiece 12 may include other conductive layers or other semiconductor elements, e.g. transistors, diodes, etc. Compound semiconductors, GaAs, InP, Si/Ge, or SiC, as examples, may be used in place of silicon.

A first insulating layer 16 is formed over the workpiece 12. The first insulating layer 16 may comprise an inter-level dielectric (ILD), for example. The first insulating layer 16 may comprise traditional dielectric materials such as silicon oxide, which has a dielectric constant of about 4.0. Alternatively, the first insulating layer 16 may comprise low dielectric constant materials, having a dielectric constant (k) of less than about 4.0, for example. The first insulating layer 16 may alternatively comprise a combination of one or more low k materials or silicon oxide, for example.

Typically, conductive lines 18/20 are formed in the first insulating layer 16 using a damascene process. In a damascene process, the first insulating layer 16 is first patterned with a pattern for at least one first conductive line 18/20. Only one conductive line 18/20 is shown in the figures; however, preferably a plurality of conductive lines 18/20 are formed in the first insulating layer 16, with each first conductive line 18/20 positioned substantially parallel to one another, when implemented in a memory array, for example. The patterns for the conductive lines 18/20 may comprise long thin trenches that are relatively straight, for example. In other applications, the pattern may comprise bends and curves, or the pattern may comprise a hole for a via, for example.

The first insulating layer 16 may be patterned directly using electron beam lithography (EBL) or alternatively, the first insulating layer 16 may be patterned by depositing a photoresist, not shown, over the first insulating layer 16, patterning the photoresist using a lithography mask, also not shown, and using the photoresist as a mask while portions of the first insulating layer 16 are etched away. The photoresist is then removed from over the first insulating layer 16 using a strip process, for example.

A conductive material 18 is deposited over the patterned first insulating layer 16 to fill the trenches formed in the first insulating layer 16. The conductive material 18 preferably comprises a conductive material such as copper. Alternatively, the conductive material may comprise copper, aluminum, silver, tungsten, alloys thereof, or combinations thereof, as examples, although alternatively, the conductive material 18 may comprise other conductive materials, for example.

An optional barrier liner 20 may be deposited over the patterned first insulating layer 16 before filling the trenches with the conductive material 18, as shown in FIG. 1. The barrier liner 20 may comprise Ta, TaN, Ti, TiN, SiN, and SiC, or combinations thereof, as examples. The barrier liner 20 may be conductive or insulating, for example. If the conductive material 18 comprises copper, preferably a barrier liner 20 is used to prevent the diffusion of the copper into the first insulating material 16, for example. The optional barrier liner 20 encases the areas of metallization so as to enhance adhesion while preventing the migration of metal atoms or ions, such as for example, copper, into the surrounding dielectric.

An excess amount of the first conductive material 18 and optional barrier liner 20 may reside over a top surface of the first insulating layer 16 after the deposition process. If present, the excess first conductive material 18 and barrier liner 20 are removed from the top surface of first insulating layer 16, using a chemical mechanical polish (CMP) process, or by an etch process, as examples, leaving at least one first conductive line 18/20 formed within the first insulating layer 16, as shown in FIG. 1. The at least one first conductive line 18/20 may comprise a plurality of first conductive lines 18/20, not shown in FIG. 1; see FIG. 8. The top surface of the first conductive line 18/20 is preferably substantially coplanar with the top surface of the first insulating layer 16, as shown.

Figure 2:
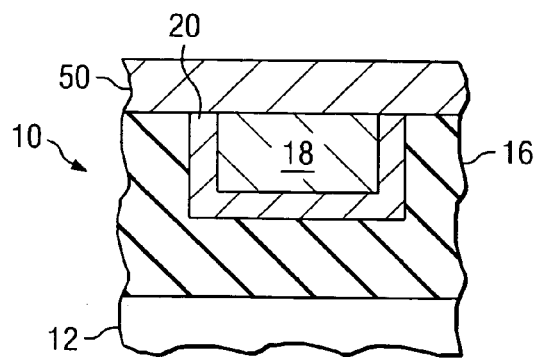

Next, in accordance with embodiments of the present invention, a novel encapsulating protective material 50 is deposited over the top surface of the first conductive line 18/20 and the top surface of the first insulating layer 16, as shown in FIG. 2. The encapsulating protective material 50 preferably comprises a conductive material so that the conductive line 18/20 will electrically connect to a subsequently-formed element or device. In one embodiment, the encapsulating protective material 50 preferably comprises TaN, Ta, Ti, TiN, or combinations thereof. For example, the encapsulating protective material 50 may comprise a single layer or two or more material layers. The encapsulating protective material 50 preferably comprises about 50 to 500 Angstroms of material, for example, although alternatively the encapsulating protective material 50 may comprise other dimensions. The encapsulating protective material 50 may be deposited by a PVD (plasma vapor deposition) or CVD (chemical vapor deposition) process, as examples, although alternatively, other deposition processes may be used to form the encapsulating protective material 50, as examples.

In one embodiment, the encapsulating protective material 50 may be planarized, e.g., using a CMP process, after depositing the encapsulating protective material 50, to ensure that a planar surface exists prior to depositing additional material layers, for example.

Because the encapsulating protective material 50 has a planar bottom surface and a planar top surface, the encapsulating protective material 50 preferably has the same thickness throughout the material 50.

Figure 3:
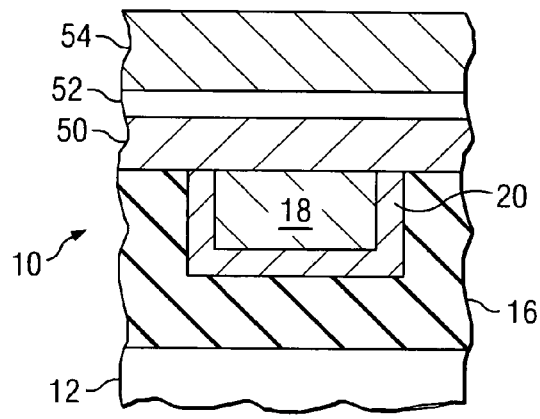

Next, at least one material layer 52 and 54 are deposited over the encapsulating protective material 50, as shown in FIG. 3. For example, the material layer 52 may comprise a magnetic stack for an MTJ, and the material layer 54 may comprise a hard mask material that will be used to pattern the MTJ. The material layers 52 and optional material layer 54 may alternatively comprise other materials that may be used to form a device or element of a semiconductor device, such as a semiconductor material, for example.

If the material layer 52 comprises a magnetic stack, as is the case in the embodiment shown in FIGS. 1–7, the material layer 52 preferably comprises one or more magnetic material layers, a thin dielectric tunnel barrier layer disposed over the magnetic material layer, and one or more magnetic material layers disposed over the tunnel barrier, for example. In particular, the material layer 52 may comprise a first magnetic layer including one or more magnetic layers. The first magnetic layer may comprise a plurality of layers of materials such as PtMn, NiMn, IrMn, FeMn, CoFe, Ru, Al, and NiFe, as examples, although alternatively, other materials may be used for the first magnetic layer, for example. The first magnetic layer is also referred to as a hard layer or a pinned layer because its magnetic orientation is fixed.

The magnetic stack also includes a thin dielectric layer comprising $Al_xO_y$, e.g., $Al_2O_3$, for example, deposited over the first magnetic layer, although alternatively, the dielectric layer may comprise other insulating materials. The dielectric layer is often referred to as a tunnel layer, tunnel junction, or barrier layer.

The magnetic stack also includes a second magnetic layer comprising similar materials as the first magnetic layer disposed over the dielectric layer. The second magnetic layer is often referred to as the soft layer or free layer because its magnetic orientation is changed depending on the desired logic state of the magnetic memory cell.

The material layer 54 may comprise a hard mask layer that is used to pattern the magnetic stack and form an MTJ. For example, the material layer 54 may comprise a conductive material such as TaN or TiN, although alternatively, other conductive hard mask materials may be used for the material layer 54.

A photoresist (not shown) is deposited over the top material layer 54, and the photoresist is used to pattern the hard mask material layer 54. The hard mask 54 is then used as a mask while the magnetic stack 52 is patterned, leaving the structure shown in FIG. 4. The magnetic materials of the magnetic stack 52 may require some rather harsh and/or aggressive etch chemistries to etch the magnetic stack 52. However, because the conductive line 18/20 is protected by the encapsulating protective material 50, a chlorine-containing substance such as a chlorine-based RIE (Reactive Ion Etch) may be used to pattern the magnetic stack 52 to form MTJ's, without damaging the first conductive lines 18/20.

Figure 4:
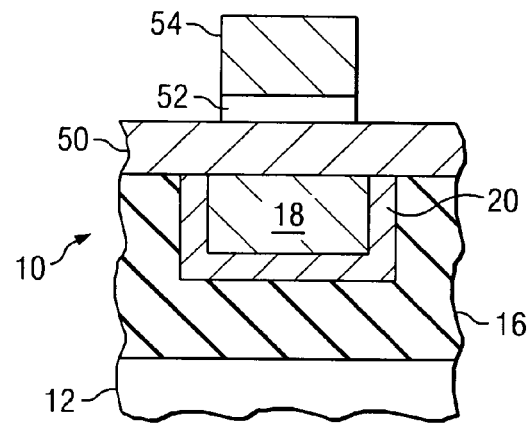
Figure 8:
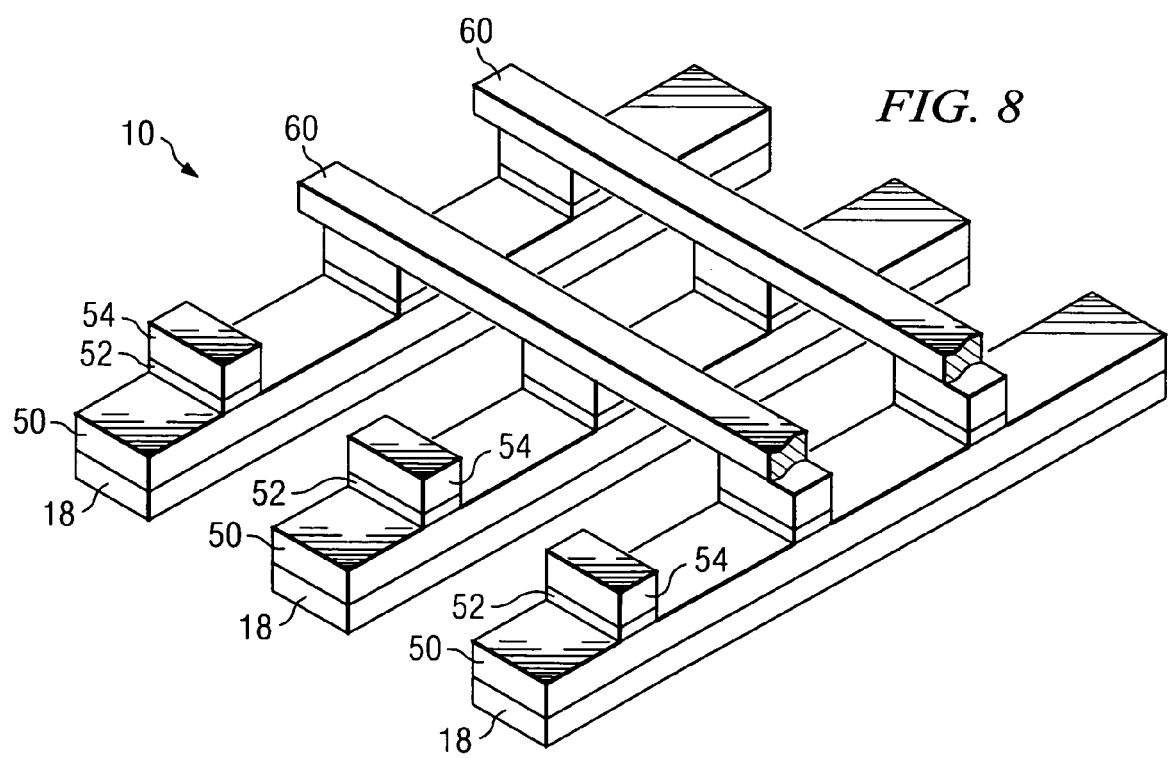
FIG. 8 shows a perspective view of an MRAM device manufactured in accordance with the embodiment shown in FIGS. 1 through 7.

Although only one MTJ 52 is shown in FIG. 4, preferably, a plurality of MTJ's 52 is formed, as shown in FIG. 8. Each MTJ 52 is disposed over a first conductive line 18/20. The MTJ's 52 may be substantially rectangular or oval in shape. The MTJ's 52 comprise resistive memory elements of an MRAM device.

The encapsulating protective layer 50 also functions as an etch stop for a subsequently deposited material layer in one embodiment. For example, a $CONH_3$ process may be used to pattern the magnetic stack 52, wherein the patterning is adapted to stop on the encapsulating protective layer 50.

Figure 5:
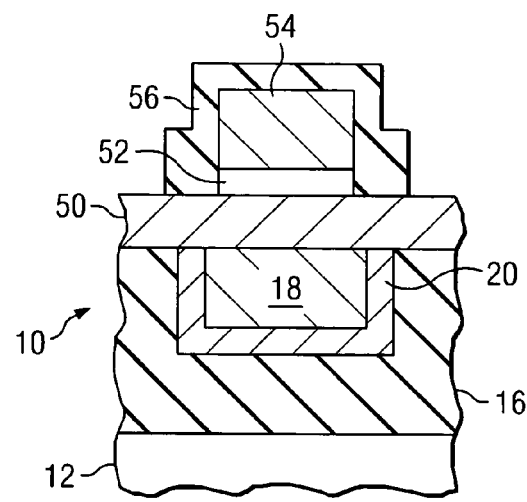

After the MTJ's 52 or material layers 52 and 54 are patterned, next, a masking material 56 is deposited over the entire surface of the workpiece 12. The masking material 56 is patterned, e.g., using a photoresist and lithography techniques, leaving the masking material 56 remaining over the top surface of the top material layer 54, the sidewalls of the material layers 52 and 54, and over a portion of the encapsulating protective material 50, as shown in FIG. 5. The masking material 56 preferably resides over substantially the entire top surface of the first conductive line 18/20, as shown. In one embodiment, the masking material 56 also preferably resides over a portion of the first insulating layer 16 proximate the first conductive line 18/20. For example, the masking material 56 may reside over about 100 Angstroms or less of the first insulating layer 16 proximate the first conductive line 18/20, although alternatively, the masking material 56 may reside over a greater amount of the first insulating layer 16, in one embodiment.

Figure 6:
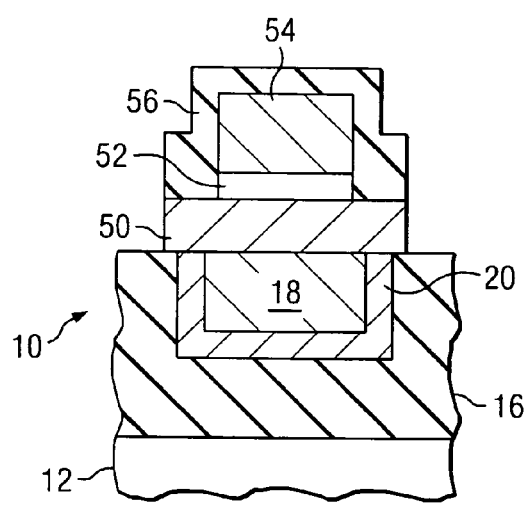

The masking material 56 preferably comprises a material that may be used as a hard mask to pattern the encapsulating protective material layer 50, as shown in FIG. 6. The masking material 56 also preferably comprises a dielectric material so that it may be left remaining in the structure 10 and may become part of a subsequently deposited inter-level dielectric (such as layer 58 in FIG. 7), in one embodiment. For example, the masking material 56 may comprise an oxide material such as $SiO_2$, a nitride material such as SiN, a carbon-containing material such as SiC or SiCN, or combinations thereof, although alternatively, the masking material 56 may comprise other materials suitable to protect the MTJ 52. The masking material 56 preferably comprises a material that may be etched selective to the material of the encapsulating protective material layer 50, for example. The masking material 56 may comprise a thickness of about 800 Angstroms or less, although alternatively, the masking material 56 may comprise other dimensions, for example.

Figure 7:
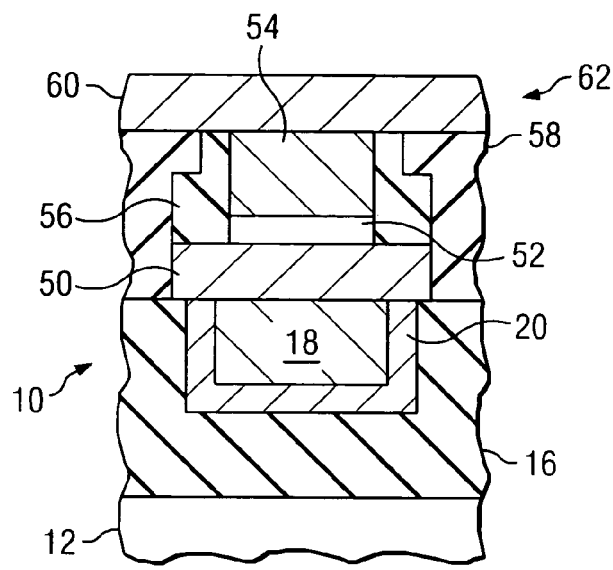

The manufacturing process for the semiconductor device 10 is then continued, as shown in FIG. 7. For example, a second insulating layer 58 comprising similar materials as described for the first insulating layer 16 may be formed over the hard mask 54, MTJ's 52, the encapsulating protective layer 50, and exposed portions of the first insulating layer 16, as shown in FIG. 7. Excess second insulating layer 58 and masking material 56 may be removed from over the top surface of the hard mask 54 using a CMP process, for example. A third insulating layer 62 may be deposited over the second insulating layer 58, and second conductive lines 60 may be formed in the third insulating layer 62 using a damascene process, although alternatively, a subtractive etch process may also be used to form the second conductive lines 60. The second conductive lines 60 may comprise a liner (not shown) and may comprise similar materials as described for the first conductive lines 18/20, for example. The second conductive lines 60 preferably make electrical contact to the hard mask 54. The third insulating layer 62 may comprise similar materials as described for the second insulating layer 58.

FIG. 8 shows a perspective view of an MRAM device 10 manufactured in accordance with the embodiment shown in FIGS. 1 through 7. A cross-point MRAM device 10 is shown; however, a FET MRAM device may also be manufacturing using the novel encapsulating protective material 50 disposed over at least first conductive lines 18/20 described herein. Embodiments of the invention have useful application in other semiconductor devices, such as other memory, logic, power, and other applications, as examples (not shown).

Advantages of embodiments of the invention include providing a encapsulating protective material 50 over conductive lines 18/20 of a semiconductor device 10, so that the underlying conductive lines 18/20 are protected during harsh and aggressive etching processes of subsequently deposited layers such as 52 and 54. Materials 52 or 54 may be used in subsequently deposited layers that are difficult to reactive ion etch with chlorine-based chemicals (which would in prior art processes and structures be difficult to etch, since practical endpoints result in exposed copper or conductive material with unacceptable corrosion of the copper or conductive material due to the chlorine). However, according to embodiments of the present invention, encapsulating at least the conductive line 18/20 top surface with an encapsulating protective material 50 such as TaN, Ta, Ti, TiN, or combinations thereof gives adequate protection for a substantial over-etch of a magnetic stack 52 without causing corrosion of the conductive lines 18/20.

The use of an optional barrier layer 20 on the sides and bottom of the trenches encases the areas of metallization 18, enhancing adhesion while preventing the migration of metal atoms or ions, such as for example, copper, into the surrounding dielectric 16.

Advantageously, encapsulating the conductive lines 18/20 with the encapsulating protective material 50 protects the conductive lines 18/20 so that very harsh or aggressive processing steps or methods can be employed in future steps. The ability to use such aggressive processing, such as for example a chlorine-based RIE, will allow the fabrication of new device architectures.

It will also be appreciated that encapsulating the areas of metallization with the encapsulating protective material 50, as discussed above, will also effectively prevent the migration of metal ions, such as copper, into surrounding or adjacent sensitive electronic elements or components. The use of the substantially planar encapsulating protective material 50 on the top surface of conductive lines and/or vias 18/20 can also inhibit surface diffusion as seen in electromigration, and can be very beneficial as a barrier to diffusion (e.g., due to electromigration). The encapsulating protective layer 50 may also function as an etch stop for a subsequently deposited material layer 52.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing a workpiece, the workpiece including an insulating layer disposed thereon and a first conductive line disposed within the insulating layer, the first conductive line having a first top surface, the insulating layer having a second top surface, wherein the second top surface of the first insulating layer is substantially coplanar with the first top surface of the first conductive line;
   depositing an encapsulating protective material over the first top surface of the first conductive line and over the second top surface of the insulating layer;
   depositing at least one material layer over the encapsulating protective material;
   patterning the at least one material layer to form a patterned structure over the first conductive line;
   depositing a masking material over the patterned structure and the encapsulating protective material;
   patterning the masking material; and
   patterning the encapsulating protective material using the masking material as a mask, wherein the encapsulating protective material protects the first conductive line during the patterning of the at least one material layer, and wherein the encapsulating protective material comprises a conductive material that is electrically coupled to the first conductive line.

2. The method according to claim 1, wherein depositing the encapsulating protective material comprises depositing TaN, Ta, Ti, TiN, or combinations thereof.

3. The method according to claim 1, wherein depositing the encapsulating protective material comprises depositing about 50 to 500 Angstroms of material.

4. The method according to claim 1, further comprising planarizing the encapsulating protective material, after depositing the encapsulating protective material.

5. The method according to claim 4, wherein planarizing the encapsulating protective material comprises a chemical mechanical polish (CMP) process.

6. The method according to claim 1, wherein depositing the masking material comprises depositing an oxide material, a nitride material, a carbon-containing material, or combinations thereof.

7. The method according to claim 1, wherein depositing the at least one material layer comprises depositing a magnetic stack over the encapsulating protective material, and depositing a hard mask over the magnetic stack, wherein the patterned structure comprises a magnetic tunnel junction (MTJ) of a magnetic memory device.

8. The method according to claim 7, wherein the first conductive line is positioned in a first direction, further comprising disposing a second conductive line over the hard mask over the MTJ, wherein the second conductive line is positioned in a second direction, the second direction being different than the first direction, wherein the magnetic memory device comprises a magnetic random access memory (MRAM) device.

9. A method of manufacturing a magnetic memory device, the method comprising:
   providing a workpiece;
   forming a plurality of first conductive lines over the workpiece, the first conductive lines having a first top surface;
   disposing a first insulating layer over the workpiece, the first insulating layer having a second top surface, wherein the first insulating layer is disposed between the first conductive lines, wherein the second top surface of the first insulating layer is substantially coplanar with the first top surface of the first conductive lines;
   depositing an encapsulating protective material over the first top surface of the first conductive lines and over the second top surface of the first insulating layer;
   depositing a magnetic stack over the encapsulating protective material;

patterning the magnetic stack to form a magnetic tunnel junction (MTJ) over each first conductive line;

depositing a first masking material over the magnetic stack and the encapsulating protective material;

patterning the first masking material; and patterning the encapsulating protective material using the first masking material as a mask, wherein the encapsulating protective material protects the plurality of first conductive lines during the patterning of the magnetic stack, and wherein the encapsulating protective material comprises a conductive material that is electrically coupled to the first conductive lines.

10. The method according to claim 9, wherein depositing the encapsulating protective material comprises depositing TaN, Ta, Ti, TiN, or combinations thereof.

11. The method according to claim 9, wherein depositing the encapsulating protective material comprises depositing about 50 to 500 Angstroms of material.

12. The method according to claim 9, further comprising planarizing the encapsulating protective material, after depositing the encapsulating protective material.

13. The method according to claim 12, wherein planarizing the encapsulating protective material comprises a chemical mechanical polish (CMP) process.

14. The method according to claim 9, wherein depositing the first masking material comprises depositing an oxide, a nitride, a carbon-containing material, or combinations thereof.

15. The method according to claim 9, wherein patterning the magnetic stack comprises depositing a second masking material over the magnetic stack, patterning the second masking material, and using the second masking material as a mask to pattern the magnetic stack.

16. The method according to claim 9, further comprising forming a plurality of second conductive lines over the encapsulating protective material, wherein the magnetic memory device comprises a magnetic random access memory (MRAM) device, wherein the MTJ's form an MRAM array.

17. The method according to claim 16, further comprising depositing a second insulating layer between the MTJ's, and forming a third insulating layer between the plurality of second conductive lines.

18. The method according to claim 9, wherein disposing the first insulating layer is before forming the plurality of first conductive lines, wherein forming the plurality of first conductive lines comprises:

patterning the first insulating layer with a pattern for the plurality of first conductive lines;

depositing a conductive material over the patterned first insulating layer; and removing excess conductive material from the second top surface of the first insulating layer.

19. The method according to claim 18, wherein removing the excess conductive material comprises a chemical mechanical polish (CMP) process.

20. The method according to claim 18, further comprising forming a liner over the patterned first insulating layer, before depositing the conductive material, wherein removing the excess conductive material includes removing the liner from the second top surface of the first insulating layer.

21. The method according to claim 9, wherein the patterning of the magnetic stack comprises a chlorine-containing substance.

22. The method according to claim 9, wherein forming the plurality of first conductive lines comprises forming copper.

* * * * *